United States Patent
Schwarz et al.

(10) Patent No.: US 9,954,150 B2
(45) Date of Patent: Apr. 24, 2018

(54) LIGHT-EMITTING SEMICONDUCTOR COMPONENT AND METHOD FOR PRODUCING A LIGHT-EMITTING SEMICONDUCTOR COMPONENT

(71) Applicant: OSRAM Opto Semiconductors GmbH, Regensburg (DE)

(72) Inventors: Thomas Schwarz, Regensburg (DE); Stefan Illek, Donaustauf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/382,578

(22) PCT Filed: Feb. 28, 2013

(86) PCT No.: PCT/EP2013/054050
§ 371 (c)(1),
(2) Date: Sep. 3, 2014

(87) PCT Pub. No.: WO2013/149772
PCT Pub. Date: Oct. 10, 2013

(65) Prior Publication Data
US 2015/0041845 A1 Feb. 12, 2015

(30) Foreign Application Priority Data
Apr. 2, 2012 (DE) .................. 10 2012 102 847

(51) Int. Cl.
*H01L 33/64* (2010.01)
*H01L 33/54* (2010.01)
(Continued)

(52) U.S. Cl.
CPC .............. *H01L 33/54* (2013.01); *H01L 33/62* (2013.01); *H01L 33/642* (2013.01);
(Continued)

(58) Field of Classification Search
CPC ....... H01L 33/62; H01L 33/64; H01L 33/642; H01L 33/644
See application file for complete search history.

(56) References Cited

U.S. PATENT DOCUMENTS 6,498,355 B1 12/2002 Harrah et al.
6,507,049 B1 1/2003 Yeager et al.
(Continued)

FOREIGN PATENT DOCUMENTS

CN 1436374 A 8/2003
CN 101984511 A 3/2011
(Continued)

*Primary Examiner* — Jae Lee
(74) *Attorney, Agent, or Firm* — Slater Matsil, LLP

(57) ABSTRACT

The invention relates to a light-emitting semiconductor component comprising a light-emitting semiconductor chip with a semiconductor layer series, a light out-coupling surface, a rear surface lying opposite said light out-coupling surface and lateral surfaces, and a support body with a shaped body that directly covers the lateral surfaces in form-locked manner, two electric contact layers and a thermal contact layer being provided on the rear surface. The thermal contact layer is electrically insulated from the electric contact layers and the semiconductor layer series, the support body has electric connection elements in direct contact with the electric contact layers and a thermal connection element in direct contact with the thermal contact layer on the rear surface and the thermal connection element at least partially forms an assembly surface of the semiconductor component facing away from the semiconductor chip. The invention further relates to a method for producing a semiconductor component.

17 Claims, 3 Drawing Sheets

(51) Int. Cl.
  *H01L 33/62* (2010.01)
  *H01L 25/075* (2006.01)
(52) U.S. Cl.
  CPC .. *H01L 25/0753* (2013.01); *H01L 2924/0002* (2013.01); *H01L 2933/005* (2013.01); *H01L 2933/0066* (2013.01); *H01L 2933/0075* (2013.01)

(56) References Cited

U.S. PATENT DOCUMENTS

| | | | |
|---|---|---|---|
| 6,927,425 | B2 | 8/2005 | Harle et al. |
| 7,355,276 | B1 | 4/2008 | Lanciault et al. |
| 7,812,360 | B2 | 10/2010 | Yano |
| 8,460,952 | B2 | 6/2013 | Park |
| 8,723,192 | B2 | 5/2014 | Weidner et al. |
| 2003/0018930 | A1 | 1/2003 | Mora et al. |
| 2003/0189830 | A1* | 10/2003 | Sugimoto ........... H01L 25/0753 362/294 |
| 2004/0012958 | A1 | 1/2004 | Hashimoto et al. |
| 2011/0049545 | A1* | 3/2011 | Basin ................. H01L 33/56 257/98 |
| 2011/0242765 | A1 | 10/2011 | Lin et al. |
| 2012/0153299 | A1* | 6/2012 | Yang ................. H01L 33/382 257/77 |
| 2012/0205697 | A1* | 8/2012 | Kim .................. H01L 33/36 257/98 |
| 2013/0175075 | A1* | 7/2013 | Kivikero ........... H01L 23/3114 174/260 |

FOREIGN PATENT DOCUMENTS

| | | |
|---|---|---|
| DE | 10246892 A1 | 4/2003 |
| DE | 10214210 B4 | 2/2011 |
| DE | 102009036621 A1 | 2/2011 |
| EP | 1806789 A2 | 7/2007 |
| EP | 2312657 A1 | 4/2011 |
| JP | 200294122 A | 3/2002 |
| JP | 2003124524 A | 4/2003 |
| JP | 2003168829 A | 6/2003 |
| WO | 2011015449 A1 | 2/2011 |

* cited by examiner

LIGHT-EMITTING SEMICONDUCTOR COMPONENT AND METHOD FOR PRODUCING A LIGHT-EMITTING SEMICONDUCTOR COMPONENT

This patent application is a national phase filing under section 371 of PCT/EP2013/054050, filed Feb. 28, 2013, which claims the priority of German patent application 10 2012 102 847.8, filed Apr. 2, 2012, each of which is incorporated herein by reference in its entirety.

TECHNICAL FIELD

A light-emitting semiconductor component and a method for producing a light-emitting semiconductor component are specified.

BACKGROUND

Light-emitting semiconductor chips are known whose electrical connections are all arranged on a main surface by which the semiconductor chips are in each case mounted on carriers. Such semiconductor chips, which have the advantage that, for example, additional electrical contacts, for instance in the form of bonding wires, are no longer necessary for the electrical connection, are also designated as so-called "flip-chips".

Since a flip-chip is typically mounted on a carrier only by way of its electrical connections, the problem arises of effectively dissipating heat from the semiconductor chip during operation.

It is known to mount a flip-chip onto a ceramic substrate, for example, wherein the electrical connections are placed onto corresponding conductor tracks of the ceramic substrate and connected to them. The advantage of a ceramic substrate is that it is electrically insulating and highly thermally conductive, and that the coefficient of thermal expansion can be chosen such that it is similar to the semiconductor chip. For connecting the semiconductor chip to the conductor tracks of the ceramic substrate, various possibilities are appropriate, for example, soldering, gold-on-gold ultrasonic bonding, adhesive bonding or sintering at a low temperature (LTS: "low temperature sintering"). However, contrasting drawbacks include increased costs, in particular in the case of large-area ceramic substrates, and a problematic adaptation of the coefficient of thermal expansion to a further heat sink, a so-called second-level heat sink, for example, a metal-core circuit board, onto which the mounted semiconductor chip with the ceramic substrate is mounted.

Furthermore, housings of the so-called QFN design (QFN: "quad flat no leads") are known, which have leadframe parts in a plastic housing on which, for example, a flip-chip can be mounted. In this case, connecting possibilities such as those described for the ceramic substrate can be used, but a QFN housing has a better thermal conduction than a ceramic substrate and is also more cost-effective than the latter. Furthermore, the adaptation of the coefficient of thermal expansion to a second-level heat sink is better than in the case of a ceramic substrate. What is disadvantageous about a QFN housing, however, is that the coefficient of thermal expansion of the housing deviates significantly from that of the semiconductor chip, which can lead to reliability problems. Moreover, the achievable minimum feature sizes in the case of QFN housings are limited by the minimum etching width of a leadframe and are more than 100 μm, for example, in the case of a 200 μm thick leadframe.

In order to attain an electrically insulating mounting side for a QFN housing, a dielectric layer, for example, composed of diamond-like carbon (DLC) or polyimide, additionally has to be applied, which has to be covered with an additional metal layer, for example, in order to be able to mount the QFN housing, for example, by soldering. As a result, although an electrical insulation of the underside of the QFN housing can be achieved, materials suitable for the insulation are associated with higher costs and often also with a poorer thermal conductivity.

With an increased effort in terms of process engineering, it is also possible to implement a QFN housing with a suitable electrical insulation on a side facing the semiconductor chip.

SUMMARY OF THE INVENTION

In accordance with at least one embodiment a light-emitting semiconductor component is disclosed. In accordance with at least one further embodiment a method for producing a light-emitting semiconductor component is disclosed.

In accordance with yet at least one other embodiment, a light-emitting semiconductor component comprises a light-emitting semiconductor chip, which has a semiconductor layer sequence having an active region for generating light. Particularly preferably, the semiconductor layer sequence can be grown by means of an epitaxy method, for example, by means of metal organic vapor phase epitaxy (MOVPE) or molecular beam epitaxy (MBE), on a growth substrate. As a result, the semiconductor layer sequence has semiconductor layers arranged one above another along an arrangement direction provided by the growth direction. Perpendicularly to the arrangement direction, the layers of the semiconductor layer sequence have a main extension plane.

The light-emitting semiconductor chip has, in particular, two main surfaces arranged perpendicularly to the growth direction. One of the main surfaces is embodied as a light coupling-out surface, by means of which the light generated during operation is emitted. Furthermore, the semiconductor chip has a rear-side surface situated opposite the light coupling-out surface and forming the second main surface of the semiconductor chip. The light coupling-out surface and the rear-side surface are connected to one another by means of side surfaces. In addition to the emission of light through the light coupling-out surface, the light generated in the active layer during operation can at least partly also be emitted by means of side surface and/or the rear-side surface.

The light-emitting semiconductor chip can have a semiconductor layer sequence based on different semiconductor material systems, depending on the wavelength. A semiconductor layer sequence based on $In_xGa_yAl_{1-x-y}As$, for example, is suitable for a long-wave, infrared to red radiation, a semiconductor layer sequence based on $In_xGa_yAl_{1-x-y}P$, for example, is suitable for red to yellow radiation and a semiconductor layer sequence based on $In_xGa_yAl_{1-x-y}N$, for example, is suitable for short-wave visible, that is to say in particular for green to blue, radiation and/or for UV radiation, wherein $0 \leq x \leq 1$ and $0 \leq y \leq 1$ hold true in each case. Furthermore, a semiconductor layer sequence based on an antimonide, for example, InSb, GaSb, AlSb, or a combination thereof, can be suitable for long-wave infrared radiation.

The growth substrate can comprise an insulator material or a semiconductor material, for example, a compound semiconductor material system mentioned above. In particular, the growth substrate can comprise sapphire, GaAs, GaP, GaN, InP, SiC, Si and/or Ge or can be composed of such a material.

The semiconductor layer sequence of the light-emitting semiconductor chip can have an active region, for example, a conventional pn junction, a double heterostructure, a single quantum well structure (SQW structure) or a multi quantum well structure (MQW structure). In the context of the application, the designation quantum well structure encompasses in particular any structure in which charge carriers can experience a quantization of their energy states as a result of confinement. In particular, the designation quantum well structure does not include any indication about the dimensionality of the quantization. It thus encompasses, inter alia, quantum wells, quantum wires and quantum dots and any combination of these structures. The semiconductor layer sequence can comprise, besides the active region, further functional layers and functional regions, for instance p- or n-doped charge carrier transport layers, undoped or p- or n-doped confinement, cladding or waveguide layers, barrier layers, planarization layers, buffer layers, protective layers and/or electrodes and combinations thereof. The structures described here concerning the active region or the further functional layers and regions are known to the person skilled in the art in particular with regard to construction, function and structure and therefore will not be explained in any greater detail at this juncture.

The growth process can take place in particular in the wafer assemblage. In other words, a growth substrate in the form of a wafer is provided, onto which the semiconductor layer sequence is grown over a large area. In a further method step, the grown semiconductor layer sequence can be singulated into individual semiconductor chips, wherein the side surfaces of the semiconductor chips can be formed by the singulation.

Furthermore, prior to singulation, the semiconductor layer sequence can be transferred to a carrier substrate and the growth substrate can be thinned, that is to say at least partly or completely removed.

In accordance with at least one embodiment, at least two electrical contact layers and a thermal contact layer are formed on the rear-side surface of the semiconductor chip, wherein the thermal contact layer is electrically insulated from the at least two electrical contact layers. In particular, the light-emitting semiconductor chip has electrical and thermal contact layers only on the rear-side surface, while the other surfaces of the semiconductor chip, in particular the light coupling-out surface, are free of contact layers.

The thermal contact layer is formed in particular in a potential-free fashion. In other words, the thermal contact layer is electrically insulated from the semiconductor layer sequence of the semiconductor chip. For this purpose, the semiconductor chip can have an electrically insulating layer between the semiconductor layer sequence and the thermal contact layer, said electrically insulating layer comprising silicon dioxide, diamond or aluminum oxide, for example, and being applied with a thickness of greater than or equal to 100 nm. During the production of the semiconductor chip, for this purpose the semiconductor layer sequence can be applied on a substrate and the electrically insulating layer can be formed in the form of a passivation layer on a side of the semiconductor layer sequence that is situated opposite the substrate, in particular the growth substrate. As an alternative thereto, it is also possible for the electrically insulating layer to be formed by a substrate on which the semiconductor layer sequence is arranged, for example, a carrier substrate, for instance a ceramic substrate. In this case, the thermal contact layer is formed on that side of the substrate which is situated opposite the semiconductor layer sequence.

The electrical contact layers can be arranged, for example, directly on the semiconductor layer sequence, that is to say in direct contact with the semiconductor layer sequence. Furthermore, it is also possible for the electrical contact layers to be arranged on an electrically insulating layer and to be electrically connected to the semiconductor layer sequence by means of electrical vias. If the semiconductor chip has two electrical contact layers, then the latter serve for applying an electrical voltage to the entire semiconductor chip. If the semiconductor chip has more than two electrical contact layers, then the semiconductor chip can also have a plurality of luminous segments that can be driven separately from one another.

The electrical contact layers and the thermal contact layer comprise, in particular, one or more metals or metal alloys or metal layer sequences. Particularly preferably, the electrical contact layers and the thermal contact layer are embodied identically.

By way of example, the contact layers can comprise Ti, Pt, Pd, Au or mixtures, alloys or layer combinations thereof. The electrical contact layers and the thermal contact layers can particularly preferably comprise, for example, an adhesion promoter layer, for example, Ti, and a mounting layer, for example, Au. Furthermore, a barrier layer, for example, Pt and/or Pd, can also be arranged therebetween.

The electrical contact layers and the thermal contact layer can be applied during the fabrication of the light-emitting semiconductor chip and can be provided as part of the semiconductor chip before the formation of the carrier body described further below. Furthermore, the contact layers can be formed, for example, by an electroplating method also after the process of molding the molded body around the semiconductor chip, as described further below, and before the production of the connection elements described further below.

In comparison with known semiconductor chips which are embodied in the form of flip-chips and have only electrical connection layers, by means of which the heat from the semiconductor chip also has to be dissipated at the same time, the semiconductor chip described here has the thermal contact layer in addition to the electrical contact layers, which thermal contact layer can enable a large-area thermal connection of the semiconductor chip to a heat sink, such that the requirements made of the electrical contact layers with regard to heat dissipation is small or even negligible. By virtue of the fact that the thermal contact layer is electrically insulated from the electrical contact layers and the semiconductor layer sequence, it is possible to place the semiconductor chip with the thermal contact layer onto an arbitrary surface having an arbitrary potential, particularly if the electrically insulating layer between the thermal contact layer and the semiconductor layer sequence is designed to be secure against electrical breakdowns.

In accordance with a further embodiment, the thermal contact layer occupies a larger area than the electrical contact layers on the rear-side surface of the semiconductor chip. This can mean, in particular, that a large part of the area of the rear-side surface is formed by the thermal contact layer, particularly preferably substantially that part of the rear-side surface which is not covered by the electrical contact layers.

In accordance with a further embodiment, the light-emitting semiconductor component comprises a carrier body, which carries the light-emitting semiconductor chip and by means of which the heat generated in the light-emitting semiconductor chip during operation can be dissipated. The carrier body can be suitable, for example, for being arranged on a further heat sink, that is to say a so-called second-level heat sink, for example, in the form of a metallic heat sink, a metal-core circuit board or a printed circuit board.

In accordance with a further embodiment, the carrier body has a molded body, which covers the side surfaces of the semiconductor chip directly and in a form-locking manner. The molded body is molded onto the semiconductor chip, in particular, and surrounds the semiconductor chip in a lateral direction, that is to say in a direction along the main extension plane of the light coupling-out surface of the semiconductor chip. In particular, the molded body can be embodied such that the light coupling-out surface of the semiconductor chip is not covered. The side surfaces of the semiconductor chip can be covered completely or, as viewed from the rear-side surface, up to a certain height in the direction of the light coupling-out surface, such that the molded body has a top side set back with respect to the light coupling-out surface. Particularly preferably, the side surfaces can be completely covered, such that the molded body has a top side that terminates flush with the light coupling-out surface. Furthermore, the rear-side surface, that is to say in particular those surfaces of the contact layers electrical contact layers which are situated opposite the semiconductor layer sequence, can also be free of the molded body. Furthermore, the top side of the molded body can also project beyond the light coupling-out surface, without said molded body covering the light coupling-out surface. As a result, the mechanical stability of the carrier body can be increased. Furthermore, as a result, a depression can be formed above the light coupling-out surface, in which a wavelength conversion element, for example, can be arranged. Furthermore, it is also possible for the molded body to cover the light coupling-out surface, such that the semiconductor chip is embedded in the carrier body and completely enclosed by the carrier body. The molded body can be formed above the light coupling-out surface, for example, such that it has a suitable optical property.

The molded body can comprise in particular a plastic material, preferably a silicone, an epoxide, an epoxide-silicone hybrid material, a polyester, or a glass having a low melting point or a glass ceramic having a low melting point. The term "having a low melting point" here denotes such glasses and glass ceramics which can be processed in a molding process at temperatures at which the semiconductor chip is not damaged. In particular, the molded body can form a mechanically stabilizing element which substantially brings about the stability of the carrier body. By means of the molded body, the semiconductor chip is embedded in particular in the carrier body.

The molded body can be implemented in particular in a molding process, for example, by means of injection molding, casting, pressing, lamination of a film or the like. Particularly preferably, the molded body can be formed by a transfer molding process, for example, a foil-assisted transfer molding process. If the light-emitting semiconductor component comprises a plurality of light-emitting semiconductor chips, then the latter can be embedded into a common carrier body and a common molded body can thus be molded around them in one method step.

A method for producing a molded body described here is described, for example, in the International publication WO 2011/015449 A1, the disclosure content of which in this regard within its full scope is incorporated by reference.

In accordance with a further embodiment, the molded body is embodied in an optically reflective fashion. This can be achieved, for example, by optically reflective particles being introduced into a matrix material of the molded body, in particular one of the materials mentioned above for the molded body. Light which emerges at the side surfaces of the light-emitting semiconductor chip can then be reflected by the molded body. Furthermore, it is possible for the molded body to be embodied in a light-transmissive fashion. This can be advantageous in particular for the case of light-emitting semiconductor chips which emit a large proportion of their light through the side surfaces. For the case where the light-emitting semiconductor chip emits the generated light substantially or exclusively by means of the light coupling-out surface, or for the case where losses as a result of the light emitted through the side surface are accepted, the molded body can, for example, also be embodied in a light-absorbing fashion and comprise a black epoxy resin, for example, which has a higher mechanical stability in comparison with a white epoxy resin.

In accordance with a further embodiment, the carrier body has electrical connection elements and a thermal connection element at the rear-side surface of the semiconductor chip. In this case, the electrical connection elements are in direct contact with the electrical contact layers of the semiconductor chip. The thermal connection element of the carrier body is in direct contact with the thermal contact layer of the semiconductor chip. "In direct contact" means that a connection element is in contact with a contact layer without a further intermediate layer or a further connecting material between them. In this case, the connection elements are in particular also not partly or wholly formed by connecting layers or connecting materials such as, for example, a solder or an electrically conductive adhesive. Furthermore, the thermal connection element at least partly forms a mounting surface of the semiconductor component that faces away from the semiconductor chip.

In accordance with a further embodiment, the electrical connection elements and the thermal connection element are applied on the semiconductor chip by electroplating. For this purpose, the electrical connection elements and the thermal connection element are applied by electroplating on the respective contact layers of the semiconductor chip on the rear-side surface of the semiconductor chip after the molded body has been formed. As a result, small feature sizes of the order of magnitude of 50 µm are possible, such that the light-emitting semiconductor component can be produced with compact dimensions. Furthermore, in electroplating methods the shapes and dimensions of the electrical connection elements and of the thermal connection element can be freely selectable, such that they can correspond to desired customer specifications, for example.

The electrical connection elements can furthermore also partly be applied on the molded body and thus extend away from the electrical contact layers in a lateral direction.

In accordance with a further embodiment, the electrical connection elements and the thermal connection element comprise copper and/or nickel. Preferably, the connection elements are formed by copper, which can be applied by an electroplating method in a simple manner in terms of process engineering.

For making electrical contact with the electrical connection elements in the carrier body, the carrier body can have at least one electrical via which is electrically connected to an electrical connection element. An electrical via can, for example, project through the molded body and be formed in the molded body. In this case, the electrical via can be integrated into the molded body during the process of molding the molded body around the semiconductor chip. Furthermore, it is also possible for the electrical via to be formed in the molded body after the latter has been molded around the semiconductor chip. The molded body can have an electrical via, for example, for each electrical connection element, such that contact can be made with the electrical connection elements and thus the electrical contact layers of the semiconductor chip from the top side of the molded body, that is to say alongside the light coupling-out surface of the light-emitting semiconductor chip. As an alternative thereto, it is also possible, for example, for an electrical via to be formed to the mounting surface of the semiconductor component. For this purpose, for example, the thermal connection element can also have an opening through which the electrical via projects.

It is furthermore possible for an electrical via to be present in the carrier body for each electrical connection element, said electrical via extending to the mounting surface, such that electrical contact can be made with the light-emitting semiconductor component by means of the mounting surface. Furthermore, it is also possible that contact can be made with one electrical connection element by means of an electrical via from the top side of the molded body or of the carrier body, while contact can be made with a further electrical contact element from the mounting surface of the carrier body.

In accordance with a further embodiment, the electrical connection elements are arranged in the interior of the carrier body. That means, in particular, that the electrical connection elements are embedded in the carrier body and contact can be made with them externally only by means of electrical vias, and not directly.

In the case where electrical contact can be made with the light-emitting semiconductor component from the top side of the carrier body, the thermal connection element preferably forms the entire mounting surface of the semiconductor component. In other words, the underside of the carrier body is formed exclusively by the thermal connection element.

The thermal connection element can have, in particular, a thickness in the direction from the rear-side surface of the semiconductor chip to the mounting surface which is greater than the thickness of the electrical connection elements, such that the thermal connection element projects beyond the electrical connection elements. Particularly preferably, the thermal connection element projects beyond the electrical connection elements in a lateral direction as well, such that the cross section of the thermal connection element widens in a direction from the semiconductor chip to the mounting surface. As a result, it is possible to achieve an increase in the thermal conductivity or a reduction of the thermal resistance, as a result of which an effective dissipation of heat from the semiconductor chip can be made possible.

In accordance with a further embodiment, an electrically insulating material is arranged between the electrical connection elements and the thermal connection element. This can be formed, for example, by an organic material, in particular a polymer material. By way of example, the electrically insulating material can be formed by a material based on benzocyclobutene (BCB).

In accordance with a further embodiment, a wavelength conversion element is arranged on the light coupling-out surface of the light-emitting semiconductor chip. In this case, the wavelength conversion element can be arranged on the light coupling-out surface before or after the process of molding the molded body around the semiconductor chip and can be formed in particular by a layer comprising one or a plurality of wavelength conversion substances. In the case of a plurality of light-emitting semiconductor chips in the carrier body, a common wavelength conversion element can be disposed downstream of the semiconductor chips, or, as an alternative thereto, a specially assigned wavelength conversion element can be disposed downstream of each of the semiconductor chips.

The wavelength conversion element comprises, in particular, at least one or a plurality of wavelength conversion substances suitable for converting the light emitted by the light-emitting semiconductor chip or a plurality of light-emitting semiconductor chips at least partly into light having a different wavelength, such that the light-emitting semiconductor component can emit mixed light comprising the light emitted primarily by the semiconductor chip and the converted secondary light. By way of example, a light-emitting semiconductor chip can emit blue light that is converted by a wavelength conversion element at least partly into green and red and/or yellow light, such that the semiconductor component can emit white light during operation. The wavelength conversion element can be applied, for example, in the form of particles embedded in a matrix material such as, for example, a plastic, for instance silicone, or ceramic. Furthermore, it is also possible for the wavelength conversion element to be embodied as a ceramic lamina which contains the wavelength conversion substance or consists of a ceramic wavelength conversion substance. The wavelength conversion element can be applied in particular directly to the light coupling-out surface.

In accordance with a further embodiment, a plurality of light-emitting semiconductor chips are arranged laterally alongside one another in the molded body. That means, in particular, that the light-emitting semiconductor component has the semiconductor chips alongside one another in a plan view of the light coupling-out surfaces of the semiconductor chips and the top side of the molded body or of the carrier body. The light-emitting semiconductor chips can be interconnected with one another in particular by electrical connection elements in the molded body. Furthermore, the carrier body can particularly preferably have a continuous thermal connection element, with which the thermal contact layers of the semiconductor chips are in direct contact, such that the heat generated in the semiconductor chips during operation can be dissipated to the mounting surface by the common thermal connection element.

In accordance with a further embodiment, a method for producing a light-emitting semiconductor component comprises the following steps:

A) providing a light-emitting semiconductor chip having a semiconductor layer sequence, having a light coupling-out surface, having a rear-side surface situated opposite the light coupling-out surface, and having side surfaces connecting the light coupling-out surface and the rear-side surface, wherein two electrical contact layers and a thermal contact layer are arranged on the rear-side surface of the semiconductor chip and the thermal contact layer is electrically insulated from the electrical contact layers and the semiconductor layer sequence;

B) forming a carrier body for the semiconductor chip comprising the following substeps:

B1) molding a molded body around the semiconductor chip, said molded body covering the side surfaces of the semiconductor chip directly and in a form-locking manner;

B2) forming electrical connection elements in direct contact with the electrical contact layers of the semiconductor chip and a thermal connection element in direct contact with the thermal contact layer of the semiconductor chip by means of an electroplating method, wherein the thermal connection element is applied with a thickness such that it forms a mounting side of the semiconductor component that faces away from the semiconductor chip.

The features and embodiments described in conjunction with the light-emitting semiconductor component equally apply to the method for producing the light-emitting semiconductor component, and vice versa.

In the case of the light-emitting semiconductor component described here and the method for producing it, a good dissipation of heat from the semiconductor chip can be achieved by means of the thermal connection element of the carrier body, which is in direct contact with the thermal contact layer of the light-emitting semiconductor chip. The method described here is distinguished particularly by the fact that the carrier body described here is more cost-effective than a ceramic carrier body, for example, and, as a result of the thermal contact element in the carrier body, an adaptation of the coefficient of thermal expansion of the carrier body and thus of the light-emitting semiconductor component to a so-called second-level heat sink is possible in a better way than in the case of a ceramic substrate, for example. On account of the electroplating method for producing the electrical and thermal connection elements, smaller feature sizes than in the case of a QFN housing, for example, are possible, such that the light-emitting semiconductor component described here can have smaller dimensions. In the case of a plurality of light-emitting semiconductor chips, the semiconductor chips can be interconnected in a simple manner in terms of process engineering by means of the electroplating method.

Further advantages, advantageous embodiments and developments will become apparent from the exemplary embodiments described below in conjunction with the figures.

In the exemplary embodiments and figures, elements that are identical, of identical type or act identically may be provided with the same reference signs in each case. The illustrated elements and their size relationships among one another should not be regarded as true to scale; rather, individual elements, such as, for example, layers, structural parts, components and regions, may be illustrated with an exaggerated size in order to enable better illustration and/or in order to afford a better understanding.

DETAILED DESCRIPTION OF ILLUSTRATIVE EMBODIMENTS

Figure 1A:
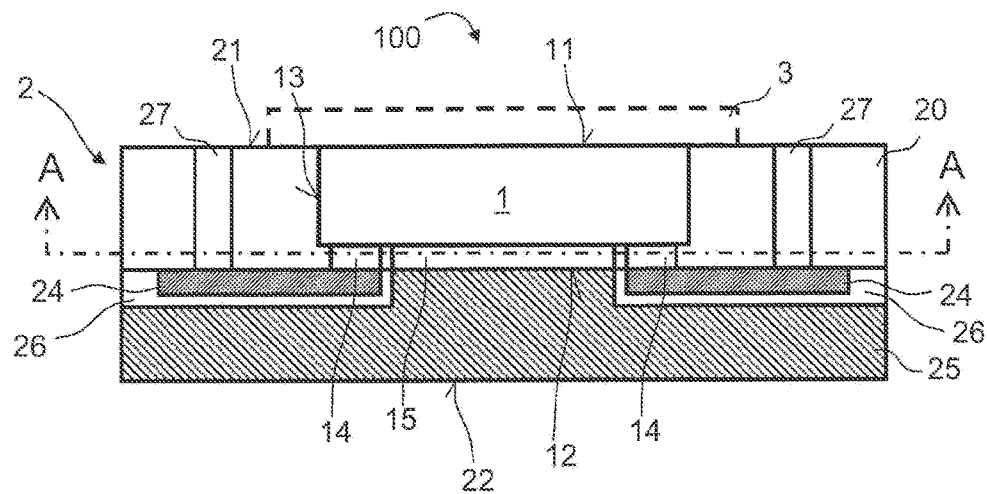
FIGS. 1A and 1B show schematic illustrations of a light-emitting semiconductor component in accordance with one exemplary embodiment.
Figure 1B:
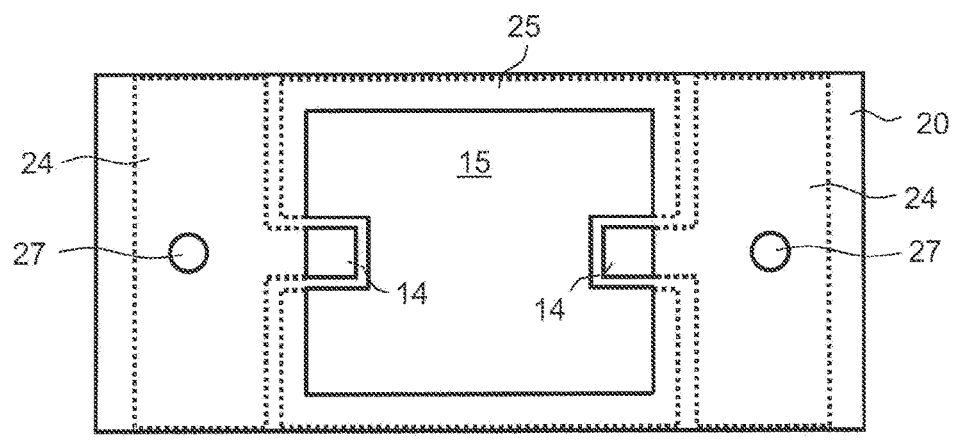

FIGS. 1A and 1B show a light-emitting semiconductor component 100 in accordance with one exemplary embodiment. FIG. 1B shows a sectional illustration of the semiconductor component 100 shown in FIG. 1A along the sectional plane A-A indicated in FIG. 1A. In FIG. 1B, the dotted lines indicate the cross sections of the electrical connection elements 24 and of the thermal connection element 25 directly beneath the semiconductor chip 1.

The light-emitting semiconductor component 100 comprises a light-emitting semiconductor chip 1 carried by a carrier body 2.

The light-emitting semiconductor chip 1 has a semiconductor layer sequence comprising at least one active layer which emits light during the operation of the semiconductor chip. Furthermore, the light-emitting semiconductor chip 1 can have a substrate in the form of a growth substrate or a carrier substrate, on which the semiconductor layer sequence is arranged. For the sake of clarity, the semiconductor layer sequence and the substrate of the semiconductor chip 1 are not shown in FIG. 1A. Exemplary embodiments of light-emitting semiconductor chips 1 are shown in conjunction with FIGS. 2A and 2B and are described further below.

The light generated during operation is emitted by means of a light coupling-out surface 11. Opposite the light coupling-out surface 11, the semiconductor chip 1 has a rear-side surface 12. The light coupling-out surface 11 and the rear-side surface 12 are connected to one another by means of side surfaces 13. The light generated during operation can also be emitted through the side surfaces and/or through parts of the rear-side surface 12 in addition to the light coupling-out surface 11. At the rear-side surface 12, the semiconductor chip 1 has two electrical contact layers 14, by means of which electrical contact can be made with the semiconductor chip 1 and in particular the semiconductor layer sequence of the semiconductor chip 1. Furthermore, the semiconductor chip 1 has a thermal contact layer 15, which is electrically insulated from the electrical contact layers 14 and from the semiconductor layer sequence of the semiconductor chip 1. The thermal contact layer 15 is thus embodied in a potential-free fashion in the semiconductor chip 1.

As is evident from FIG. 1B, the thermal contact layer 15 preferably forms a large part of the rear-side surface 12 of the semiconductor chip, such that a large-area thermal connection of the semiconductor chip is possible. In particular, the thermal contact layer 15 is embodied in such a way that it forms the entire rear-side surface 12 of the electrical semiconductor chip apart from the electrical contact layers 14 and gaps for the electrical insulation of the thermal contact layer 15 from the electrical contact layers 14.

The carrier body 2 has a molded body 20, which covers the side surfaces 13 of the semiconductor chip 1 directly and in a form-locking manner. In this case, the molded body 20 can be embodied in such a way that, as shown in FIG. 1A, it completely covers the side surfaces 13 of the semiconductor chip 1. As an alternative thereto, it can also be possible that the side surfaces 13 of the semiconductor chip 1 are only partly covered by the molded body 20, such that the latter can have a smaller height than the semiconductor chip 1. Particularly preferably, the molded body 20 does not cover the light coupling-out surface 11 of the semiconductor chip 1 and has a top side 21 that terminates flush with the light coupling-out surface 11, as is shown in FIG. 1A.

Furthermore, the top side 21 of the molded body 20 can project beyond the light coupling-out surface 11, without said molded body covering the light coupling-out surface 11. As a result, the mechanical stability of the carrier body 2 can be increased. Furthermore, as a result, a depression can be formed above the light coupling-out surface 11, in which a wavelength conversion element 3, for example, can be arranged.

As an alternative to the exemplary embodiment shown, the molded body 20 can also cover the light coupling-out surface 11, such that the semiconductor chip 1 is enclosed in the carrier body 2 and surrounded by the latter on all sides. The molded body 20, above the light coupling-out surface 11, for example, can be shaped in a targeted manner or embodied in a material-specific fashion, for example, in a lens-shaped fashion or provided with fillers, in order to have desired optical properties, for example, a desired light concentration or scattering.

The molded body 20 is molded onto the semiconductor chip 1 and comprises or is composed of a material that is processable in a molding process, for example, an epoxide, a silicone, a silicone-epoxide hybrid material or a polyester. Depending on the emission properties of the semiconductor chip 1, the molded body 20 can be embodied as transparent, light-absorbing, light-reflecting or light-scattering and comprise corresponding particles and/or fillers in the abovementioned material.

A wavelength conversion element 3 can be applied on the light coupling-out surface 11 of the semiconductor chip and thus on the top side 21 of the carrier body 2 or of the molded body 20 and can convert at least part of the light generated by the light-emitting semiconductor chip 1 into light that is different from that.

In order to produce the light-emitting semiconductor component 100, the semiconductor chip 1 is provided.

Figure 2A:
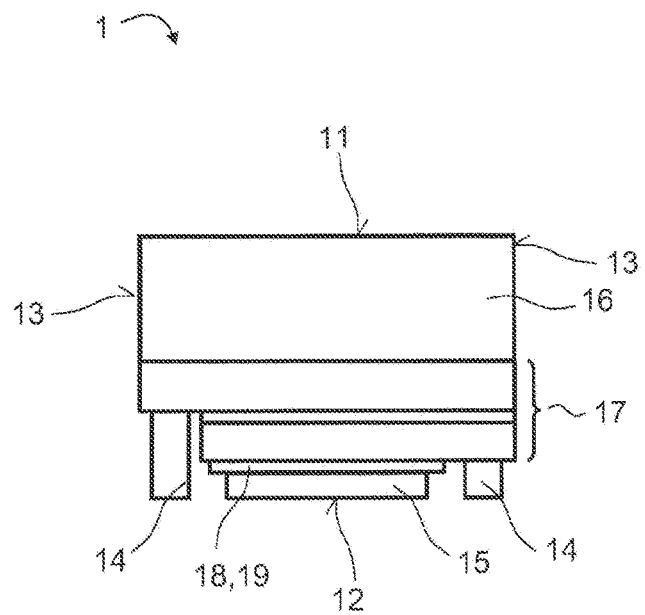
FIGS. 2A and 2B show schematic illustrations of light-emitting semiconductor chips in accordance with further exemplary embodiments.
Figure 2B:
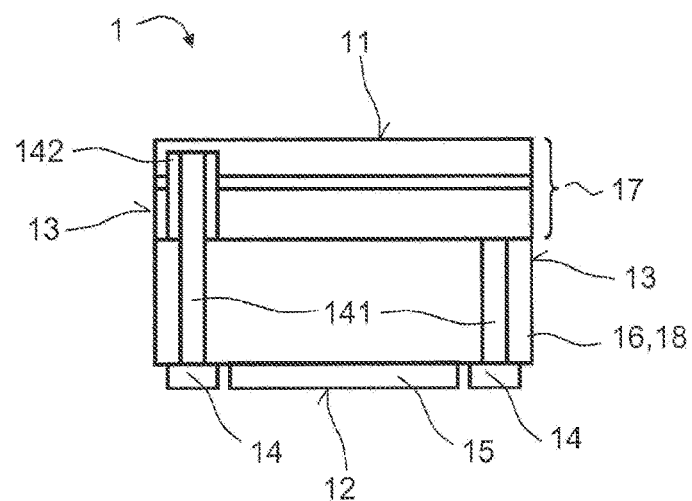

In this respect, FIGS. 2A and 2B show exemplary embodiments of light-emitting semiconductor chips 1 which can be provided in each case for the light-emitting semiconductor component 100 and which each have a substrate 16, on which a semiconductor layer sequence 17 having an active region is arranged.

FIG. 2A shows a light-emitting semiconductor chip 1 in which the substrate 16 is formed by the growth substrate for producing the semiconductor layer sequence 17. By means of a structuring of the semiconductor layer sequence 17, electrical contact layer 14 can be arranged on the same side of the semiconductor layer sequence 17.

Furthermore, the semiconductor chip 1 has a thermal contact layer 15 on the semiconductor layer sequence 17, which thermal contact layer is electrically insulated from the semiconductor layer sequence 17 by an electrically insulating layer 18 formed by a passivation layer 19. The passivation layer preferably comprises silicon dioxide, diamond or aluminum oxide and has a thickness of greater than or equal to 100 nm.

By contrast, the light-emitting semiconductor chip 1 in FIG. 2B has as substrate 16 a ceramic substrate embodied as a carrier substrate, to which the semiconductor layer sequence 17 was transferred after being grown on a growth substrate. The electrical contact layers 14 are applied on that side of the substrate 16 which faces away from the semiconductor layer sequence 17, and are contact-connected to the semiconductor layer sequence 17 by means of electrical vias 141. The reference sign 142 denotes an electrical insulation of one of the vias 141 for making contact with that side of the semiconductor layer sequence 17 which faces away from the substrate 16.

Furthermore, the thermal contact layer 15 is applied on that side of the substrate 16 which faces away from the semiconductor layer sequence 17, wherein the substrate 16 in this case forms the electrically insulating layer 18 in order to electrically insulate the thermal contact layer 15 from the semiconductor layer sequence 17.

After the light-emitting semiconductor chip 1 has been provided, the carrier body 2 is produced. For this purpose, in a first substep, the side surfaces 13 of the semiconductor chip 1 are covered with the material of the molded body 20 directly and in a form-locking manner. This is done by the molded body 20 being molded around the semiconductor chip in a molding process, in particular by a transfer molding process in the exemplary embodiment shown.

In a further method step for producing the carrier body 2, connection elements 24, 25 are formed in direct contact with the contact layers 14, 15 of the semiconductor chip. For this purpose, the electrical connection elements 24 and part of the thermal connection element 25 are applied by means of an electroplating method on the electrical contact layers 14 and on the thermal contact layer 15. As is evident from FIG. 1A, the electrical connection elements 24 can also be applied partly on the molded body 20 in a manner leading away from the semiconductor chip 1.

Afterward, an electrically insulating material 26 is applied, which covers the electrical connection elements 24 and the already applied part of the thermal connection element 25. The electrically insulating material 26 is removed again above the already applied part of the thermal connection element 25, such that the latter can be reinforced further by a continuation of the electroplating method. In particular, it is thereby possible to embed the thermal connection elements 24 in the electrically insulating material 26 and thus in the carrier body 2 and to produce the thermal connection element 25 with an increasing width. The thermal connection element 25 can thereby be formed such that it is thicker than the electrical connection elements 24 and projects beyond the electrical connection elements 24 also in a lateral direction in addition to a vertical direction. The electrically insulating material 26 is formed in particular by a photopatternable material such as, for instance, a photopatternable resist, for example, by a polymer based on BCB.

The electrical connection elements 24 and the thermal connection element 25 comprise, in particular, copper and/or nickel. Preferably, the connection elements 24, 25 are formed by copper, which can be applied in a simple manner in terms of process engineering by means of an electroplating method.

A connection of the connection elements 24, 25 to the contact layers 14, 15 which is simple in terms of process engineering and which allows small feature sizes of the order of magnitude of approximately 50 μm is possible by means of the electroplating method. In the case of thin connection elements 24, 25 it is possible to achieve a low stress loading, for example, caused by thermal strains, on the semiconductor chip 1, while the thermal connection element 25, which is significantly thicker in comparison with the electrical connection elements 24, enables a good thermal conductivity. By virtue of the fact that the thermal contact layer 15 is formed in a potential-free fashion, that is to say in an electrically insulated fashion, on the semiconductor layer sequence 17 of the semiconductor chip 1, the thermal connection element 25 is likewise electrically insulated from the semiconductor layer sequence 17 of the semiconductor chip 1, such that an additional electrical insulation of the thermal connection element 25 is not necessary.

Electrical contact can be made with the electrical connection elements 24 externally, as in the exemplary embodiment shown, by means of electrical vias 27 in the molded body 20. These vias, as they are called, are provided, for example, as discrete elements together with the light-emitting semiconductor chip 1 and the molded body 20 is molded around them. Furthermore, it is also possible to provide or form in the molded body 20 openings which are at least partly or wholly filled with an electrically conductive material in order to form the electrical vias. The electrical vias 27 make it possible to make contact with the light-emitting semiconductor chip 1 and thus the light-emitting semiconductor component 100 from the top side 21 of the carrier body 2, such that the thermal connection element 25 preferably forms the entire mounting surface 22 situated opposite the top side 21.

Particularly preferably, the light-emitting semiconductor component 100 can be produced in an assemblage with further semiconductor components. For this purpose, a common molded body 20 can be molded around a plurality of light-emitting semiconductor chips 1. After the formation of the electrical and thermal connection elements 24, 25 and, if appropriate, of the electrical vias 27 and thus after the completion of a carrier body assemblage, the latter can be divided into individual semiconductor components 100. The singulation produces side surfaces of the carrier body 2 which may have traces of material removal, for example, in the form of sawing grooves or grinding traces that originate from the singulation.

Figure 3:
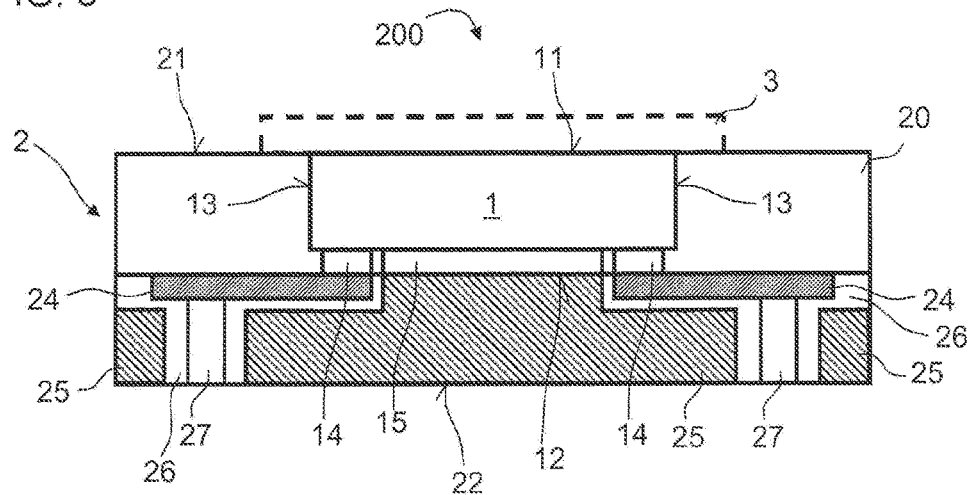
FIG. 3 shows a schematic illustration of a light-emitting semiconductor component in accordance with a further exemplary embodiment.
Figure 4:
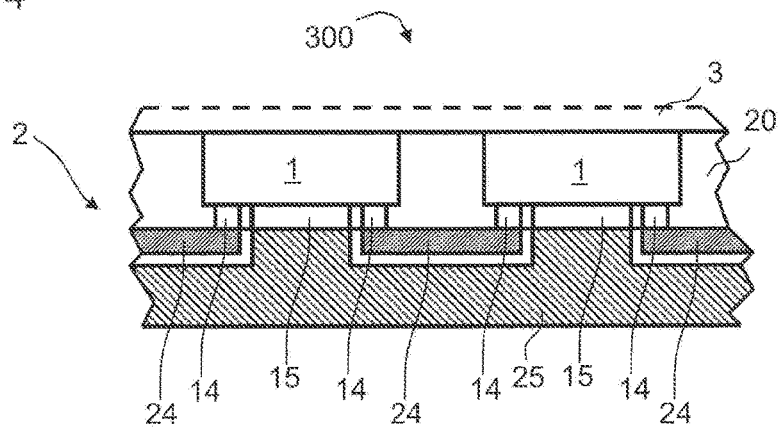
FIG. 4 shows a schematic illustration of a light-emitting semiconductor component in accordance with a further exemplary embodiment.

FIG. 3 shows a light-emitting semiconductor component 200 in accordance with a further exemplary embodiment, which, in comparison with the light-emitting semiconductor component 100, enables electrical contact to be made from the mounting surface 22. For this purpose, the thermal connection element 25 has openings in which electrical vias 27 are arranged and are insulated from the thermal connection element 25 by the electrically insulating material 26.

Furthermore, it is also possible to provide electrical connection possibilities in the form of vias 27 both on the top side 21 and on the underside or mounting surface 22.

As a result of the electroplating method for applying the electrical connection elements 24 and the thermal connection element 25 and as a result of the arrangement of electrical vias 27 in the molded body 20 and/or in the thermal connection element 25, the mounting surface 22 can be configured in any desired manner with regard to the thermal and electrical connection possibilities.

FIG. 3 shows an excerpt from a further exemplary embodiment of a light-emitting semiconductor component 300, which, in comparison with the previous exemplary embodiments, comprises a plurality of semiconductor chips 1 around which a common molded body 20 is molded.

The semiconductor chips 1 are interconnected with one another by means of electrical connection elements 24 in the carrier body 20. Furthermore, the light-emitting semiconductor component 300 comprises a thermal connection element 25, which is directly adjoined by the thermal contact layers 15 of the semiconductor chips 1, such that the thermal connection element 25 can be embodied as a continuous thermal connection element which can dissipate the heat generated by the semiconductor chips 1 during operation.

The exemplary embodiments and features described in the Figures can also be combined with one another. In addition or as an alternative to the features shown in the exemplary embodiments, the light-emitting semiconductor components 100, 200, 300 can also comprise further features in accordance with the description in the general part.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A method for producing a light-emitting semiconductor component, the method comprising:
    providing a light-emitting semiconductor chip, the semiconductor chip comprising a semiconductor layer sequence, a light coupling-out surface, a rear-side surface situated opposite the light coupling-out surface, and side surfaces connecting the light coupling-out surface and the rear-side surface; and
    forming a carrier body comprising a molded body, which directly covers the side surfaces of the semiconductor chip in a form-locking manner,
    wherein electrical contact layers and a thermal contact layer are located on the rear-side surface of the semiconductor chip,
    wherein the thermal contact layer is electrically insulated from the electrical contact layers and the semiconductor layer sequence,
    wherein the carrier body has, at the rear-side surface of the semiconductor chip, electrical connection elements in direct contact with the electrical contact layers of the semiconductor chip and a thermal connection element in direct contact with the thermal contact layer of the semiconductor chip,
    wherein the electrical connection elements and the thermal connection element are formed on the semiconductor chip by electroplating, and
    wherein the thermal connection element at least partly forms a mounting surface of the semiconductor component that faces away from the semiconductor chip.

2. The method according to claim 1, wherein the molded body terminates flush with the light coupling-out surface.

3. The method according to claim 1, wherein a wavelength conversion element is arranged on the light coupling-out surface.

4. The method according to claim 1, wherein the carrier body has an electrically insulating material between the electrical connection elements and the thermal connection element.

5. The method according to claim 1, wherein the electrical connection elements are arranged in an interior of the carrier body.

6. The method according to claim 1, wherein the electrical connection elements are partly applied on the molded body.

7. The method according to claim 1, wherein the thermal connection element projects beyond the electrical connection elements in a lateral direction.

8. The method according to claim 1, wherein the molded body has an electrical via which is electrically connected to an electrical connection element.

9. The method according to claim 8, wherein the thermal connection element forms the entire mounting surface of the semiconductor component.

10. The method according to claim 1, wherein the semiconductor chip has an electrically insulating layer between the semiconductor layer sequence and the thermal contact layer.

11. The method according to claim 1, wherein the thermal contact layer occupies a larger area than the electrical contact layers on the rear-side surface of the semiconductor chip.

12. The method according to claim 1, wherein, in the molded body, a plurality of light-emitting semiconductor chips are arranged laterally alongside one another and the carrier body has a continuous thermal connection element, with which the thermal contact layers of the semiconductor chips are in direct contact.

13. A method for producing a light-emitting semiconductor component, the method comprising:
provliding a light-emitting semiconductor chip, the semiconductor chip comprising a semiconductor layer sequence, a light coupling-out surface, a rear-side surface situated opposite the light coupling-out surface, and side surfaces connecting the light coupling-out surface and the rear-side surface, wherein electrical contact layers and a thermal contact layer are arranged on the rear-side surface of the semiconductor chip and the thermal contact layer is electrically insulated from the electrical contact layers and the semiconductor layer sequence; and
forming a carrier body for the semiconductor chip by:
molding a molded body around the semiconductor chip, the molded body directly covering the side surfaces of the semiconductor chip in a form-locking manner; and
after molding the molding body around the semiconductor chip, forming electrical connection elements in direct contact with the electrical contact layers of the semiconductor chip and a thermal connection element in direct contact with the thermal contact layer of the semiconductor chip by an electroplating method, wherein the thermal connection element is applied with a thickness such that it forms a mounting side of the semiconductor component that faces away from the semiconductor chip.

14. The method according to claim 1, wherein the molded body does not cover the light coupling-out surface.

15. A method for producing a light-emitting semiconductor component, the method comprising:
providing a light-emitting semiconductor chip, the semiconductor chip comprising a semiconductor layer sequence, a light coupling-out surface, a rear-side surface situated opposite the light coupling-out surface, and side surfaces connecting the light coupling-out surface and the rear-side surface;
forming electrical contact layers on the rear-side surface of the semiconductor chip;
forming a thermal contact layer on the rear-side surface of the semiconductor chip, wherein the thermal contact layer is electrically insulated from the electrical contact layers and the semiconductor layer sequence; and
forming a carrier body for the semiconductor chip by:
molding a molded body directly covering the side surfaces of the semiconductor chip;
forming electrical connection elements on the molded body and in direct contact with the electrical contact layers of the semiconductor chip; and
forming a thermal connection element on the molded body and in contact with the thermal contact layer of the semiconductor chip, wherein the electrical connection elements and the thermal connection element are formed on the semiconductor chip by electroplating.

16. The method according to claim 15, wherein the molded body comprises electrical through-vias electrically connected to the electrical connection elements.

17. The method according to claim 15, further comprising electrical vias, wherein the electrical vias are electrically connected to the electrical connection elements, and wherein the thermal connection element comprises openings, and wherein the electrical vias are disposed in the openings.

* * * * *

UNITED STATES PATENT AND TRADEMARK OFFICE
CERTIFICATE OF CORRECTION

| | |
|---|---|
| PATENT NO. | : 9,954,150 B2 |
| APPLICATION NO. | : 14/382578 |
| DATED | : April 24, 2018 |
| INVENTOR(S) | : Schwarz et al. |

It is certified that error appears in the above-identified patent and that said Letters Patent is hereby corrected as shown below:

In the Claims

In Column 14, Line 47, Claim 6, delete "applied" and insert --formed--.

Signed and Sealed this
Tenth Day of July, 2018

Andrei Iancu
*Director of the United States Patent and Trademark Office*